(12) United States Patent
Lin et al.

(10) Patent No.: US 7,338,909 B2
(45) Date of Patent: Mar. 4, 2008

(54) MICRO-ETCHING METHOD TO REPLICATE ALIGNMENT MARKS FOR SEMICONDUCTOR WAFER PHOTOLITHOGRAPHY

(75) Inventors: Yu-Liang Lin, Hsin-Chu (TW); Henry Lo, Hsinchu (TW); Chung-Long Chang, Dou-Liu (TW); Gorge Huang, Hsin-Chu (TW); Tony Lu, Hsin-chu (TW); Gnesh Yeh, Hsin-Chu (TW); Candy Liang, Kaohsiung (TW); Chun-Hsien Lin, Hsin-Chu (TW); Mei Sheng Zhou, Singapore (SG); Sunny Su, Douliou (TW); Ai-Sen Liu, Hsinchu (TW); Cheng-Lin Huang, Hsin-Chu (TW); Li-Jui Chen, Hsin-Chu (TW); Shih Che Wang, Hsin-Chu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 362 days.

(21) Appl. No.: 10/872,238

(22) Filed: Jun. 18, 2004

(65) Prior Publication Data

US 2005/0282396 A1 Dec. 22, 2005

(51) Int. Cl.
*H01L 21/302* (2006.01)
*H01L 21/461* (2006.01)

(52) U.S. Cl. ............... 438/745; 438/748; 257/E21.224; 257/E21.228

(58) Field of Classification Search ............... 438/745, 438/748; 216/92; 257/E21.221, E21.223
See application file for complete search history.

(56) References Cited

U.S. PATENT DOCUMENTS

| | | | | |
|---|---|---|---|---|
| 5,271,798 | A * | 12/1993 | Sandhu et al. | 438/745 |
| 6,375,792 | B1 * | 4/2002 | Dow et al. | 156/345.11 |
| 6,746,966 | B1 * | 6/2004 | Chang et al. | 438/734 |

FOREIGN PATENT DOCUMENTS

TW   396402   10/1987

* cited by examiner

*Primary Examiner*—Caridad Everhart
(74) *Attorney, Agent, or Firm*—Tung & Associates

(57) ABSTRACT

A method and apparatus for locally etching a substrate area the method including providing a substrate comprising a process surface; depositing a material layer over the process surface; and, applying a wet etchant to cover a targeted etching portion of the process surface while excluding an adjacent surrounding area to selectively etch the material layer overlying the targeted etching portion.

42 Claims, 3 Drawing Sheets

MICRO-ETCHING METHOD TO REPLICATE ALIGNMENT MARKS FOR SEMICONDUCTOR WAFER PHOTOLITHOGRAPHY

FIELD OF THE INVENTION

This invention generally relates to semiconductor processing methods including photolithographic patterning and more particularly to a method for replicating alignment marks according to a micro-etching process for improving overlay accuracy in semiconductor wafer photolithography.

BACKGROUND OF THE INVENTION

In the integrated circuit industry today, hundreds of thousands of semiconductor devices are built on a single chip. Every device on the chip must be electrically isolated to ensure that it operates independently without interfering with another. With the high integration of the semiconductor devices, the accuracy of formation of feature patterns overlying a previously defined semiconductor device level is increasingly difficult as critical dimensions shrink. Overlay accuracy, also referred to as registration is critical to proper functioning of a semiconductor device. To successfully pattern an overlying feature level on the wafer, the wafer feature pattern must be accurately aligned with a newly applied pattern image included in a reticle for proper transfer of the image to the photoresist layer on the wafer. A reticle is used in step-and-repeat and step-and-scan optical exposure systems common in the art of semiconductor device fabrication to transfer feature patterns to individual die on the wafer surface in a multi-level semiconductor device.

In forming the various levels of a multi-level semiconductor device including shallow trench isolation features, semiconductor wafer alignment for positioning the semiconductor wafer, for subsequent device feature patterning is critical. In a typical photolithographic patterning procedure, an automated stepper, for example, an ASM Lithography photo system sequentially positions the wafer beneath a photoimaging system for transferring a patterned photoimage of device features formed on a reticle to expose a photoresist material overlying the semiconductor wafer surface. As positioning of the process wafer is critical for forming semiconductor features, methods for forming alignment marks in the semiconductor wafer surface have evolved to allow the automated stepper to optically sense the alignment marks for proper process wafer positioning.

Several wafer alignment strategies exist for using different patterns and locations to achieve the alignment of a semiconductor wafer to a reticle containing an image to be transferred to the wafer. These strategies vary from alignment marks located between shot sites (also known as chip sites) to global alignment marks located in two shot sites at the periphery of the wafer. There are also global strategies in which the alignment marks are located between shot sites in the more peripheral regions of the wafer. The overlay accuracy required for proper alignment, frequently referred to as an overlay budget is about one third of the critical dimension. As device technologies scale to about 0.10 microns and below, conventional methods for forming and replicating alignment marks are no longer sufficiently accurate.

In one approach for global alignment, at least two areas at the wafer periphery are selected, typically located on opposite sides of the wafer diameter and include a series of parallel scribe marks covering a rectangular or square area of about 50 square microns to about 400 square microns referred to as zero-level alignment marks that are etched into the silicon before other processing steps. The global alignment marks are subsequently replicated in each subsequent level of manufacturing the multi-level semiconductor device.

Shallow trench isolation (STI), is a preferred electrical isolation technique especially for a semiconductor chip with high integration. STI features can be made using a variety of methods including, for example, the Buried Oxide (BOX) isolation method for shallow trenches. The BOX method involves filling the trenches with a chemical vapor deposition (CVD) silicon oxide (SiO2), also referred to as an STI oxide which is then chemically mechanically polished (CMP) to remove the overlying layer of STI oxide to yield a planar surface. The shallow trenches etched for the BOX process are anisotropically plasma etched into the substrate, for example, silicon, and are typically between 0.3 and 1.0 microns deep.

Shallow trench isolation features with trenches having submicrometer dimensions are effective in preventing latch-up and punch-through phenomena. Broadly speaking, conventional methods of producing a shallow trench isolation feature include: forming a hard mask, for example silicon nitride, over the targeted trench layer, for example including a pad oxide layer, patterning a photoresist over the hard mask to define a trench feature, anisotropically etching the hard mask to form a patterned hard mask, and thereafter anisotropically etching the trench feature to form the shallow trench isolation feature. Subsequently, the photoresist is removed (e.g., stripped) and the shallow trench isolation feature is back-filled, with a dielectric material, for example a CVD silicon oxide, also referred to as an STI oxide.

In processes according to the prior art, for example, associated with trench isolation manufacture, a first layer of insulating dielectric, often referred to as an STI oxide, for example, silicon oxide, is formed to backfill trenched areas formed in a silicon substrate to form shallow trench isolation features around active areas of the device, During the various material depositions and planarization steps the wafer peripheral areas including areas containing alignment marks (alignment mark areas) reflect various global material deposition and planarization steps that are carried out to form semiconductor devices in the active areas of the process wafer. As a result of active area processing steps the alignment mark areas include a layer of the STI oxide.

To preserve replication of the alignment marks for use in subsequent photolithographic patterning steps, in one approach in the prior art, an etching process is carried out on the STI oxide to form a window area to surround the alignment mark areas and to expose the underlying alignment marks with the window area having a depth greater than a subsequent STI oxide CMP polishing depth. In a blind photo imaging process to replicate the alignment marks a manually assisted alignment process is used to position the wafer for photolithographic patterning of the alignment mark areas (fields) for a subsequent etching process to replicate the alignment marks. A wet or dry etching process is then used to etch away the STI oxide overlying the alignment mark areas. A CMP step is then carried out to planarize the wafer including removing excess STI oxide over the active areas of the device. Following the STI oxide CMP step, a layer of polysilicon is typically conformally deposited over the alignment mark areas in parallel with active area processing steps, thereby replicating the alignment marks.

One problem according to prior art methods of replicating alignment marks, is that the manually assisted method for blindly positioning the process wafer for alignment mark etching is not sufficiently accurate, frequently requiring the formation of a relatively wide clear out window surrounding the alignment mark areas to ensure exposure of the alignment marks during etching. In addition, the window areas formed to surround the alignment marks in the STI oxide etching step form a recessed area present during the subsequent STI oxide CMP step. As a result, in carrying out the STI oxide CMP step residual particles from the slurry and polishing surface tend to become entrained in the recessed area requiring extensive cleaning processes frequently including another photolithographic patterning and etching step to replicate or restore the optical contrast of the alignment marks. Further, the need for an additional photolithographic patterning and etching process to clear out the alignment mark areas significantly increases the processing time. Other shortcomings in the prior art methods for replicating alignment mark areas include the possibility of overpolishing the alignment mark area during the STI oxide CMP process, thereby reducing a thickness window of the underlying silicon nitride layer and leading to the potentiality of damage to the silicon substrate.

Another problem in prior art methods for replicating alignment marks is the relative contrast of the alignment marks which are detected by an auto-imaging system. For example, a Helium-Neon laser having a wavelength between about 500 nm to about 630 run and which neutrally affects photoresists, is typically used as the light source in an alignment process. Many dielectric films are transparent in this wavelength range thereby presenting little interference with reflections from an underlying alignment mark area, typically having a higher extinction coefficient material to provide contrast producing reflections. During the processing of several levels in a multi-level semiconductor device, the alignment mark areas frequently are covered with high extinction coefficient materials such as SiGe, silicon carbide (e.g., SIC), silicon oxynitride (e.g. SiON), metal salicides, polysilicon, and metallic layers. While the alignment mark trenches are frequently not completely covered thereby losing their definition, the sharpness of the definition is decreased. As overlay budgets approach 20 to 30 nanometers for 0.10 micron critical dimensions and lower, a small decrease in the definition of the alignment marks by overlayers of high extinction coefficient materials is increasingly detrimental to overlay accuracy. In many cases an additional step to photolithographically pattern and etch the alignment mark area is economically prohibitive in terms of process cycle time and material cost.

Therefore, there is a need in the semiconductor processing art to develop an improved method for selectively etching alignment mark areas to replicate alignment marks such that costly process wafer photolithographic and etching process cycles may be avoided while improving high definition alignment mark optical contrast for improved overlay accuracy.

It is therefore an object of the invention to provide an improved method for selectively etching alignment mark areas to replicate alignment marks such that costly process wafer photolithographic and etching process cycles may be avoided while improving high definition alignment mark optical contrast for improved overlay accuracy including overcoming other shortcomings of the prior art.

SUMMARY OF THE INVENTION

To achieve the foregoing and other objects, and in accordance with the purposes of the present invention, as embodied and broadly described herein, the present invention provides a method and apparatus for locally etching a substrate etching area.

In one embodiment, the method includes providing a substrate comprising a process surface;depositing a material layer over the process surface; and, applying a wet etchant to cover a targeted etching portion of the process surface while excluding an adjacent surrounding area to selectively etch the material layer overlying the targeted etching portion.

In another embodiment, the method includes providing a semiconductor wafer comprising a process surface including an alignment mark area comprising readable alignment marks; depositing a material layer according to a semiconductor device fabrication process over the process surface; and, selectively applying a wet etchant to the alignment mark area to the exclusion of a surrounding area to selectively etch the material layer overlying the alignment mark area to reproduce readable alignment marks.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with respect to the parallel effect of various processing steps of an active area of a semiconductor process wafer on alignment mark areas, for example global alignment mark areas (fields) disposed at the peripheral portions of the semiconductor process wafer. For example, the method of the present invention is explained with reference to the parallel effects of active area processing on alignment mark areas in connection with the formation of shallow trench isolation (STI) features and subsequent processing steps commonly used for forming CMOS semiconductor features. It will be appreciated that the method of the present invention may be applied to replicate (reproduce) readable alignment marks in any alignment mark field (area) following the deposition of any material layer in a semiconductor wafer processing step where an alignment mark area is advantageously replicated or reproduced without the need for a separate wafer photolithographic patterning and etching step. The term 'active areas' as used herein refers to areas of the semiconductor process surface where electrically active areas are formed for operating a completed semiconductor device. The term 'anisotropic etching' refers to a reactive ion etching (RIE) process otherwise referred to as plasma enhanced etching.

In one embodiment of the present invention, a material layer is deposited to cover a semiconductor process surface including readable alignment marks disposed within an alignment mark area. A wet etchant is then selectively applied to a targeted etching area, for example the alignment mark area to selectively etch the process surface. For example, in one embodiment, the targeted etching area is an alignment mark area where an overlying material layer is removed to replicate (reproduce) the readable alignment marks and improve optical contrast thereby improving overlay accuracy.

Figure 1A:
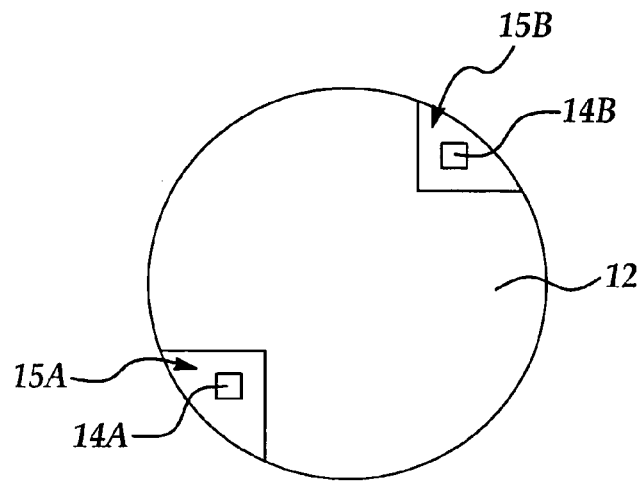
FIG. 1A is a top planar view of an exemplary semiconductor wafer showing conceptually representative alignment mark areas.

For example, referring to FIG. 1A is shown a top planar view an exemplary semiconductor process wafer 12 including global alignment mark areas, 14A and 14B disposed at a peripheral portion of the process wafer surface. For example, the alignment mark areas are square areas 14A and 14B having a dimension of about 0.4 mm by 0.4 mm located in areas e.g., 15A and 15B, not including active device (die) areas.

Figure 1B:
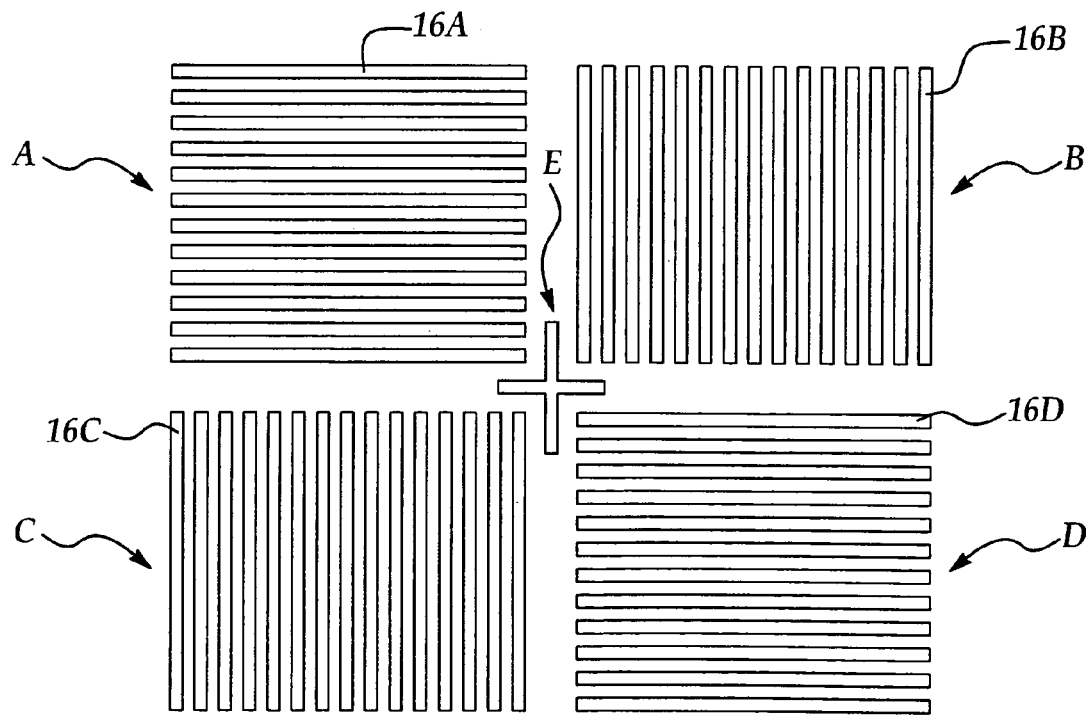
FIG. 1B is shown in an expanded top planar view of an exemplary typical alignment mark area according to an embodiment of the present invention.

Referring to FIG. 1B is shown an expanded top planar view of a typical alignment mark area including trenches (readable alignment marks) e.g., 16A, 16B, 16C, 16D formed in 4 quadrants, A, B, C, and D with adjacently disposed quadrants having trenches formed at right angles with respect to one another. A central cross shaped portion E, having trenches formed at right angles to form a cross shape is located at the intersection of the four quadrants to aid in optical alignment processes. The trenches, for example, are zero level readable alignment marks formed in the semiconductor substrate by a photolithographic and anisotropic etching process prior to other processing steps.

Figure 2A:
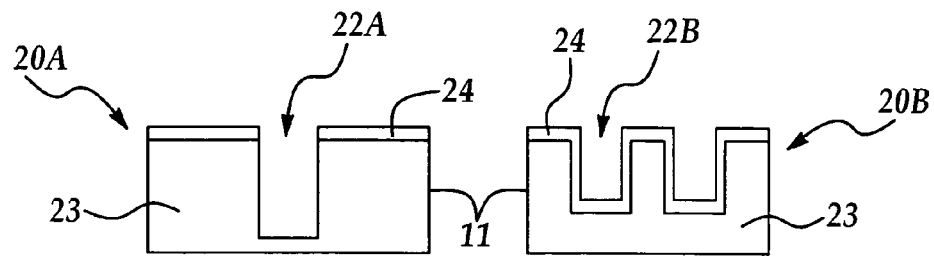
FIGS. 2A-2E are cross sectional side views of an exemplary alignment mark area shown in juxtaposition to an active device area at different stages of semiconductor device manufacture according to the present invention.

In an exemplary implementation of the present invention, Referring to FIG. 2A, is shown a shallow trench isolation (STI) area 20A having an anisotropically etched trench portion 22A formed in semiconductor wafer, e.g., silicon wafer 23 shown juxtaposed to an alignment mark area 20B having anisotropically etched alignment mark trenches e.g., 22B in the silicon substrate. For example, the alignment mark trenches have a depth of about 1200 Angstroms and a width of about 8 microns. It will be appreciated that the STI area 20A and the alignment mark areas 20B are separated on the process wafer surface and are shown juxtaposed for comparison purposes. Shown lining the alignment mark trenches, e.g., 22B is a silicon nitride (e.g., SiN) layer, 24 which also overlies the silicon surface in the active areas e.g., STI area 20A. The STI trench 22A and the alignment mark trenches, e.g., 22B are formed by a conventional photolithographic and RIE etching process. The STI trench 22A is formed following the formation of the alignment mark trenches and following deposition of a silicon nitride layer.

Figure 2B:
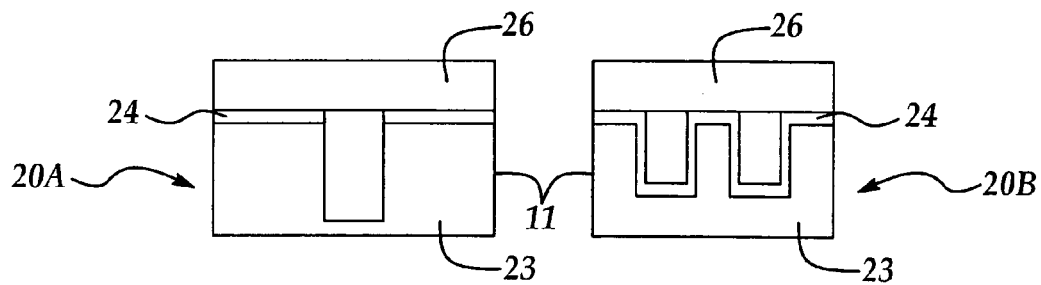
Figure 2C:
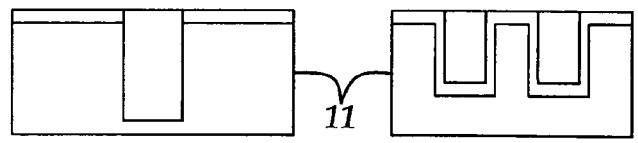

Referring to FIG. 2B, a silicon dioxide (SiO2) based layer 26, also referred to as an STI oxide, is deposited by conventional methods to backfill the STI trench 22A and in parallel backfills the alignment mark trenches, e.g., 22B. For example the STI oxide layer is formed having a thickness of about 3000 Angstroms to about 6000 Angstroms. Referring to FIG. 2C, in the method according to the present invention an STI oxide CMP process is carried out to remove excess STI oxide and to planarize the wafer process surface for further processing. In contrast to the prior art, the STI oxide CMP process is carried out prior to a wet etching process replicating the alignment mark trenches e.g., 22B in alignment mark area 20B.

Figure 2D:
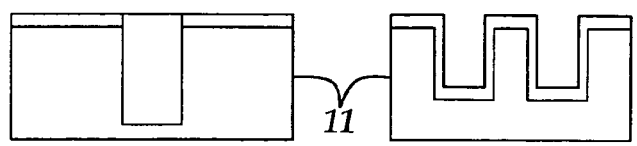

Referring to FIG. 2D, following the STI oxide CMP process, in one embodiment of the method according to the present invention a wet etchant for removing the STI oxide is locally applied to the alignment mark area 20B to substantially remove the STI oxide overlying the alignment mark trenches to reproduce readable alignment marks. By the term "substantially remove" is meant a sufficient amount to make the alignment marks readable, for example greater than about 95 percent, preferably about 100 percent of the STI oxide covering the alignment mark trenches is removed. Preferably, a small portion of a wet etching solution in the microliter range, for example, about 20 microliters to about 60 microliters, is applied over the alignment mark area 20B preferably covering the entire area of the alignment mark, for example a 0.4 mm by 0.4 mm area. Preferably, the amount of wet etching solution is sufficient to cover the alignment mark area without substantially covering adjacent portions on the semiconductor surface. In the case of etching an oxide layer, e.g., the STI oxide overlying the alignment mark area, the wet etching solution is preferably a HF containing solution, for example 49% HF, or a conventional buffered oxide etching (BOE) solution, for example including 49 percent hydrogen fluoride buffered with ammonium fluoride (NH4F) to have an oxide etching rate of about 1400 Angstroms/minute, for example having 10 parts NH4F (e.g., 454 g NH4F in 680 ml H2O) to 1 part 49 percent by volume HF. In one embodiment, a wafer cleaning process is carried out following the localized wet etching process, for example dipping the process wafer in a solution of NH4OH and deionized water with optional simultaneous agitation of the solution for example megasonic agitation.

Figure 2E:
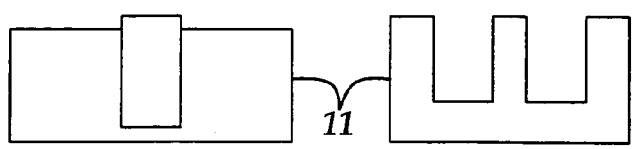

Referring to FIG. 2E, following the localized wet etching process according to one embodiment of the present invention to removed the STI oxide overlying the alignment mark area, the silicon nitride layer 24 is removed according to a conventional wet etching process, using hot phosphoric (H3PO4) acid.

It will be appreciated that other wet etching solutions depending on the type of material overlying the alignment mark area may be used. For example, in one embodiment, a titanium or cobalt layer formed over the alignment mark area in parallel with forming titanium silicide or cobalt silicide contacts is preferably locally etched and removed according to the present invention over the alignment mark areas. For example, a conventional etchant including ammonium hydroxide (NH$_4$OH) and hydrogen peroxide (H$_2$O$_2$) may suitably be used. It will be appreciated that other types of high extinction coefficient materials, such as SiGe, SiC, SiON, metal salicides, and metal layers formed overlying the alignment mark area in various semiconductor device fabrication processes are also preferably removed by the localized wet etching process to reproduce readable alignment marks within the alignment mark areas according to preferred embodiments of the present invention to improve an overlay accuracy in the formation of an overlying level of semiconductor device features.

It will be appreciated that the amount of etching solution applied in the localized wet etching (micro-etching) process according to the present invention will depend in part on the size of the alignment mark area, for example, from about 0.4 mm by about 0.4 mm to about 1 mm by about 1 mm, the size and tip characteristics of the applicator tip, surface tension characteristics of the process wafer surface (target surface)

and application process used according to aspects of the present invention to locally apply the etchant solution. For example, the wet etchant solution is preferably applied using an etchant resistant applicator tip, for example formed from machineable plastics resistant to the wet etchant used, for example, hydrogen fluoride. For example, plastics such as polytetrafluoroethylene (PTFE), polyethylene, polypropylene, polyvinyl chloride (PVC), polyetheretherketone (PEEK), phenolic, liquid crystal polymer (LCP), thermoplastic polyimide (TPI) or polyphthalamide (PPA), and the like are suitable for formation of the etchant resistant applicator tip.

Figure 3A:
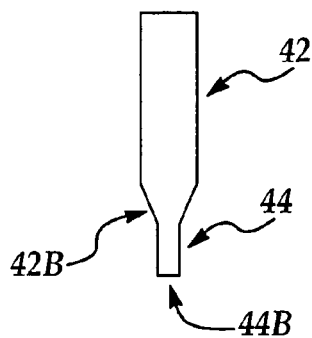
FIGS. 3A and 3B are cross sectional representations of exemplary portions of an applicator tip used in implementing an embodiment of the method of the present invention.
Figure 3B:
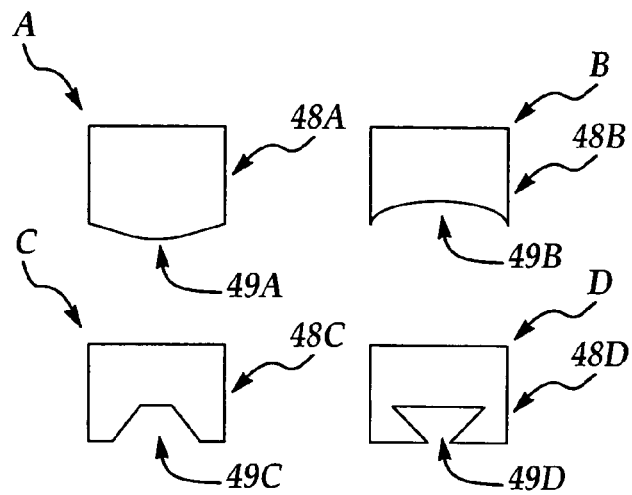

For example, referring to FIG. 3A, according to the present invention is shown an exemplary applicator tip for exemplary implementation of the localized micro etching process according to one embodiment of the present invention. For example, the applicator tip includes a larger diameter outer portion 42 which transitions to a smaller diameter tip portion 44 including a distal tip portion 44B according to a tapered portion 42B. Referring to FIG. 3B are shown cross sectional views of exemplary applicator tips showing distal solution applicator portions of the applicator tip. For example in embodiment A, the distal end of the tip portion 48A may include a radius portion e.g., 49A, for example with a positive radius of curvature to allow slight protrusion of the distal end of the applicator tip into a recessed area, for example a recessed alignment mark area in the target wafer surface. Alternatively in embodiment B, the distal end of the tip portion 48B may include a radius portion e.g., 49B, for example with a negative radius of curvature to control the surface tension characteristics of a drop (not shown) of liquid etchant solution attached to the distal tip portion. It will be appreciated that the radius of curvature may be altered to modify the surface tension characteristic of a drop of liquid attached to a distal tip portion and thereby alter the target surface coverage characteristics of the applied etching solution on contacting the target surface. It will be appreciated that such surface tension characteristics may additionally be altered by varying the relative hydrophobicity and hydrophilicity of both the distal tip portion, for example by the use of surface coatings known in the art, and the targeted etching surface. Alternative embodiments of the distal drop application portion 48C and 48D of the applicator tip are shown in embodiments C and D, where a cone shaped cavity 49C and 49D, respectively are formed in the distal drop application portion of the applicator tip. It will be appreciated that the cavity may be other than a circular cone, for example a cross section of the cavity forming a polygonal shape.

Preferably, the tip portion 44 of the applicator tip has a diameter of from about 0.2 mm to about 2 mm, more preferably from about 0.2 mm to about 0.7 mm for application to an alignment mark area. It will be appreciated that the size of the applicator tip diameter may be varied depending on the target feature size to be etched.

In an exemplary application of the localized micro etching process the tip portion 44 of the applicator tip is at least partially immersed into a reservoir of the etchant solution and withdrawn including a portion of the etchant solution remaining attached to the applicator tip according to surface tension (energy) effects. The applicator tip is then positioned over the wafer etching target area and the applicator tip contacts the wafer etching target area to transfer a portion of the etchant solution according to respective surface tension (energy) effects. Optionally, at least one of the applicator tip and the process surface may be moved relative to one another to apply the etchant solution to the process surface.

For example, a robotic arm, preferably an X, Y, Z robotic arm is preferably used to hold and transfer the applicator tip including a moveable positioning stage, such as an X, Y positioning stage to position the semiconductor wafer process surface. For example, the alignment mark area of the wafer may be positioned either manually through an optical alignment viewfinder or by an automated process where the wafer including the alignment mark area is positioned at an X, Y position corresponding to the X, Y position of the applicator tip by reference to wafer locating marks, for example wafer notches to locate a predetermined wafer alignment mark area location. The applicator tip is then lowered to make contact with the wafer process surface and either withdrawn or optionally moved relative to the wafer surface and then withdrawn. The surface energy of the wafer surface acts to transfer a portion of the etchant solution on the applicator tip to the wafer surface. In the case the applicator tip contacts the etching target area and is withdrawn, for example, a hemispherically shaped drop of etching solution is formed and held in place by surface tension and preferably covers the etching target, for example the alignment mark area. It will be appreciated that the amount of etching solution will depend on the relative hydrophobicity and hydrophilicity of both the applicator tip and the target area, for example the alignment mark area on the wafer process surface.

Figure 4A:
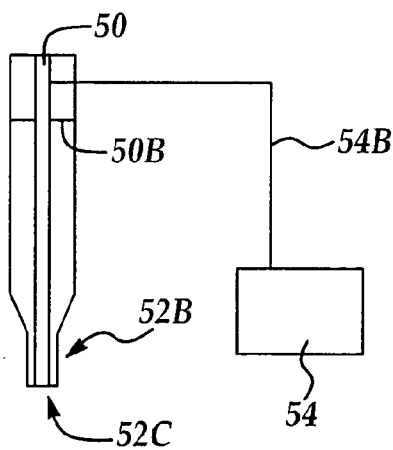
FIGS. 4A and 4B are exemplary cross sectional schematic views of an applicator tip and fluid moving means according to exemplary embodiments of the present invention.

Referring to FIG. 4A, in one embodiment, the applicator tip includes one or more openings forming capillary channels e.g. 50 longitudinally along the center portion of the applicator tip and communicating with the distal tip portion 52B of the applicator tip 52 having opening 52C for applying the etchant solution. Preferably, the capillary channel opening 50 is about ⅛ to about ¾ of the outer diameter of the tip portion, for example from about 0.1 mm to about 0.4 mm. In this embodiment, when at least the distal tip portion 52B of the applicator tip is immersed in the etchant solution, capillary forces within the one or more capillary channels preferably withdraw a portion of the etchant solution into a portion of the capillary channel. Subsequently, on contacting the targeted etching surface area, a portion of the etching solution within the channel preferably will be partially withdrawn together with a drop portion attached to the distal end portion. In embodiments including one or more capillary channels, more than one application of the applicator tip to the target surface may be applied to carry out more than one wet etching application prior to returning the applicator tip to contact the reservoir of etching solution to obtain additional etching solution. Upon contacting the targeted etching surface, a portion of the etchant solution is preferably withdrawn to form a localized etching area (drop) on the target surface each time the applicator tip contacts the etching target surface as long as etching solution remains in the capillary channel.

Still referring to FIG. 4A in another embodiment, a negative and positive pressure producing means 54 may be attached in gaseous communication by, for example, gaseous communication line 54B to the capillary channel 50, preferably above a fluid withdrawing level e.g., 50B of the capillary opening. Pressure producing means 54 preferably has the ability to withdraw several hundred microliters of fluid while being able to deliver about 1 to about 100 microliters of fluid by producing precisely controllable positive or negative changes in a pressure. For example, as is known in the art, piezoelectric membranes enclosing a portion of a gaseous or fluidic space may be electrically activated to produce slight deformations in the enclosing space and thereby produce controllable pressure changes causing fluidic flow. For example, the pressure producing means is used to form at least a negative pressure to withdraw an etching solution into the capillary channel portion of the applicator tip upon immersion of the tip in a reservoir of etching solution.

Figure 4B:
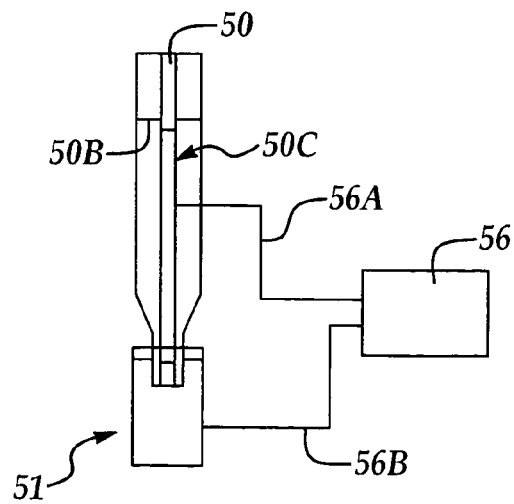

Referring to FIG. 4B, in another embodiment, electrokinetic or electrophoretic fluid flow of the etching solution within the capillary opening portion of the applicator tip is used to at least withdraw the etching solution into the capillary channel 50 from a solution reservoir e.g., 51. For example, a separate capillary tube e.g., 50C, having preferred opening inner diameters of about 0.1 mm to about 0.4 mm are separately formed and inserted into the capillary channel 50 where the capillary channel functions as a retaining sleeve for the capillary tube 50C. The capillary tube 50C is formed by methods known in the art of microfluidics for forming capillary tubes, for example a glass material including adding an electrically conductive coating over apportion of the outer diameter of the capillary tube. Preferably the capillary tube or at least the conductive coating formed over a portion of the outside diameter of the capillary tube ends at a point above the opening in distal tip 52B of the capillary channel sleeve. The electrically conductive coating is in electrical communication with a power supply 56, for example by electrical communication line 56A and with etchant solution reservoir 51 including an electrode (not shown) by electrical communication line 56B for providing a continuous or pulsed voltage or current to the capillary tube to cause movement of fluid. For example, an electrochemical potential is created within the capillary tube 50C, for example, when the capillary tube is immersed in an etching solution reservoir 51 including a second electrode for completing an electrochemical circuit.

In operation, upon immersion of the distal tip portion 52B preferably the capillary tube 50C including an electroded portion makes contact with the solution reservoir where upon application of an appropriate voltage or current between the capillary tube and a solution reservoir electrode to create an electrochemical potential, fluid is drawn into the capillary tube. The etching solution reservoir may advantageously include buffers and surfactants as are known in the art to increase the electroflow characteristics and electrochemical lifetime of the etching solution. Upon withdrawal of the capillary tip or interrupting the electrochemical potential, fluid flow is stopped. Capillary forces and surface tension at the tip portion will preferably retain the withdrawn fluid in the capillary upon interruption of the applied voltage or current or interrupting the electrochemical potential. Subsequent applications of the fluid in controlled microliter size portions, for example from about 1 microliter to about 100 microliters may be accomplished by a variety of ways. For example, a negative or positive pressure may be applied to the capillary tube in a controlled manner as previously discussed. Alternatively, the applicator tip may include a distal tip portion with varying cavity sizes or radii of curvature as previously discussed to alter drop application characteristics to deliver a controlled amount of fluid to the target surface where the etching solution is delivered according to contact time and relative surface energies between the applicator tip and the targeted etching surface upon contact. For example, the amount of etching solution delivered to a targeted etching area upon contact will be primarily controlled by the amount of time the applicator tip contacts the surface and the relative hydrophobicity or hydrophilicity of both the applicator tip and the targeted surface.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for locally etching a semiconductor wafer mark area comprising the steps of:
   providing a semiconductor wafer comprising a process surface including an alignment mark area comprising readable alignment marks;
   depositing a material layer according to a semiconductor device fabrication process over the process surface; and,
   selectively applying a wet etchant to the alignment mark area to the exclusion of a surrounding area to selectively etch the material layer overlying the alignment mark area to reproduce readable alignment marks, said step of applying comprising using an applicator tip having a distal tip portion formed of a plastic material, said distal tip portion comprising a surface for holding a droplet of wet etchant without absorbing said wet etchant, said droplet attached to said surface according to a surface tension of said surface, said surface comprising a geometry selected from the group consisting of a positive radius of curvature, a negative radius of curvature, and a cone shaped cavity.

2. The method of claim 1, wherein said distal tip portion has a diameter of about 0.1 mm to about 0.8 mm.

3. The method of claim 1, wherein the plastic material has an etching resistance to the etchant solution.

4. The method of claim 1, wherein the plastic material comprises at least one of polytetrafluoroethylene (PTFE), polyethylene, polypropylene, polyvinyl chloride (PVC), polyetheretherketone (PEEK), phenolic, liquid crystal polymer (LCP), thermoplastic polyimide (TPI) and polyphthalamide (PPA).

5. The method of claim 1, wherein the material layer comprises silicon dioxide overlying alignment marks disposed within the alignment mark area.

6. The method of claim 5, wherein the wet etchant comprises hydrogen fluoride (HP).

7. The method of claim 1, wherein the step of selectively applying a wet etchant to the alignment mark area comprises applying about 1 to about 100 microliters to cover the alignment mark area.

8. The method of claim 7, wherein the step of applying a wet etchant to a targeted etching portion comprises applying about 20 to about 100 microliters covering the targeted etching portion.

9. The method of claim 1, wherein the material layer comprises a material having a transmission coefficient of less than about 20% with respect to an illuminating wavelength of about 500 nm to about 630 nm.

10. The method of claim 9, wherein the material layer comprises at least one of germanium, polysilicon, silicon carbide, silicon oxynitride, titanium suicide, cobalt silicide, copper, aluminum, and tungsten.

11. The method of claim 1, wherein the step of selectively applying a wet etchant to the alignment mark area further comprises:
   a) contacting an applicator tip with an etchant solution;
   b) positioning the applicator tip over the alignment mark area;
   c) contacting the applicator tip comprising said droplet to the alignment mark area to transfer an etching solution portion to cover the targeted etching portion for etching the material layer; and, d) withdrawing the applicator tip from the alignment mark area.

12. The method of claim 11, wherein the step of contacting the applicator tip to the alignment mark area further comprises moving one of the alignment mark area and the applicator tip.

13. The method of claim 11, wherein a portion of the etching solution is displaced info a channel opening portion disposed longitudinally within the applicator tip during the step of contacting an applicator tip with an etchant solution.

14. The method of claim 13, wherein at least one of an electrophoretic force and a negative pressure is applied to at least a portion of the channel opening.

15. The method of claim 11 wherein said distal tip portion has a diameter of about 10 microns to about 10 mm.

16. The method of claim 15, wherein the distal tip portion. comprises one of a positive radius of curvature and a negative radius of curvature at a contacting portion of the distal tip portion to alter the volume of the etchant solution applied to the targeted etching portion.

17. The method of claim 11, wherein a portion of the etching solution is at least partially displaced out of the channel opening portion onto the alignment mark area during the step of contacting the applicator tip to the alignment mark area.

18. The method of claim 17, wherein at least one of an electrophoretic force and a positive pressure is applied to the channel opening portion.

19. The method of claim 18, wherein the channel opening comprises a capillary tube having at least a portion of an outer diameter including an electro-conductive electrode for applying an electric potential.

20. A method for locally etching a substrate etching area comprising the steps of:
providing a substrate comprising a process surface;
depositing a material layer over the process surface; and,
applying a wet etchant to cover a targeted etching portion of the process surface while excluding an adjacent surrounding area to selectively etch the material layer overlying the targeted etching portion, said step of applying comprising using an applicator tip having a distal tip portion formed of a plastic material, said distal tip portion comprising a surface for holding a droplet of wet etchant without absorbing said wet etchant, said droplet attached to said surface according to a surface tension of said surface, said surface comprising a geometry selected from the group consisting of a positive radius of curvature, a negative radius of curvature, and a cone shaped cavity.

21. The method of claim 20, wherein the etching solution comprises at least one of HE and NH4OH.

22. The method of claim 20, wherein said applicator tip further comprises a channel opening disposed longitudinally within the applicator tip communicating with said distal tip portion, said channel opening wherein at least one of an electrophoretic force and a positive or negative pressure is applied to at least a portion of the channel opening to displace wet etchant therein.

23. The method of claim 20, wherein the targeted etching portion comprises an alignment mark area formed in a semiconductor process wafer.

24. The method of claim 23, wherein the alignment mark area comprises a material layer overlying readable alignment marks.

25. The method of claim 24, wherein the material layer is selected from the group consisting of silicon dioxide, germanium, polysilicon, silicon carbide, silicon oxynitride, titanium silicide, cobalt suicide, copper, aluminum, and tungsten.

26. The method of claim 20, wherein the step of selectively applying a wet etchant to the targeted etching portion further comprises:
a) contacting an applicator tip with an etchant solution to withdraw an etchant solution portion;
b) positioning the applicator tip over the targeted etching portion;
c) contacting the applicator tip comprising said droplet to the targeted etching portion to transfer at least a portion of the etching solution portion over the targeted etching portion; and,
d) withdrawing the applicator tip from the targeted etching portion.

27. The method of claim 26, further comprising the step of moving the applicator tip parallel to the process surface following the step of contacting.

28. The method of claim 26, wherein the step of positioning the applicator tip comprises at least one of moving the applicator tip and moving the process surface.

29. A method for locally etching a semiconductor wafer mark area comprising the steps of:
providing a semiconductor wafer comprising a process surface including an alignment mark area comprising readable alignment marks;
depositing a material layer according to a semiconductor device fabrication process over the process surface; and,
selectively applying a wet etchant in the amount of about 1 to about 100 microliters covering the targeted etching portion to the alignment mark area to the exclusion of a surrounding area to selectively etch the material layer overlying the alignment mark area to reproduce readable alignment marks.

30. The method of claim 29, wherein the material layer comprises silicon dioxide overlying alignment marks disposed within the alignment mark area.

31. The method of claim 29, wherein the wet etchant comprises hydrogen fluoride (HF).

32. The method of claim 29, wherein the step of applying a wet etchant to a targeted etching portion comprises using an applicator tip having a distal tip portion having a diameter of about 0.1 mm to about 0.8 mm.

33. The method of claim 29, wherein the step of selectively applying a wet etchant to the alignment mark area further comprises:
a) contacting an applicator tip with an etchant solution;
b) positioning the applicator tip over the alignment mark area;
c) contacting the applicator tip to the alignment mark area to transfer an etching solution portion to cover the targeted etching portion for etching the material layer; and,
d) withdrawing the applicator tip from the alignment mark area.

34. The method of claim 33, wherein the step of contacting the applicator tip to the alignment mark area further comprises moving one of the alignment mark area and the applicator tip.

35. The method of claim 33, wherein a portion of the etching solution is displaced within a channel opening portion disposed longitudinally within the applicator tip during the step of contacting an applicator tip with an etchant solution.

36. The method of claim 35, wherein at least one of an electrophoretic force and a positive pressure is applied to the channel opening portion.

37. The method of claim 35 wherein the applicator tip comprises a distal tip portion having a diameter of about 10 microns to about 10 mm.

38. The method of claim 35, wherein the distal tip portion comprises one of a positive radius of curvature and a negative radius of curvature at a contacting portion of the distal tip portion to alter the volume of the etchant solution held as a droplet on the distal tip portion.

39. The method of claim 38, wherein the distal tip comprises a plastic material having an etching resistance to the etchant solution.

40. The method of claim 39, wherein the plastic material comprises at least one of polytetrafluoroethylene (PTFE), polyethylene, polypropylene, polyvinyl chloride (PVC), polyetheretherketone (PEEK), phenolic, liquid crystal polymer (LCP), thermoplastic polyimide (TPI) and polyphthalamide (PPA).

41. A method for locally etching a semiconductor wafer mark area comprising the steps of:

providing a semiconductor wafer comprising a process surface including an alignment mark area comprising readable alignment marks;

depositing a material layer according to a semiconductor device fabrication process over the process surface; and, selectively applying a wet etchant covering the targeted etching portion to the alignment mark area to the exclusion of a surrounding area to selectively etch the material layer overlying the alignment mark area to reproduce readable alignment marks, said step of selectively applying comprising using an applicator tip having a distal tip portion having a diameter of about 0.1 mm to about 0.8 mm.

42. The method of claim 41, wherein the step of selectively applying a wet etchant to the alignment mark area comprises applying about 1 to about 100 microliters to cover the alignment mark area.

* * * * *